US006898561B1

(12) United States Patent
Liu et al.

(10) Patent No.: US 6,898,561 B1
(45) Date of Patent: May 24, 2005

(54) METHODS, APPARATUS AND COMPUTER PROGRAM PRODUCTS FOR MODELING INTEGRATED CIRCUIT DEVICES HAVING REDUCED LINEWIDTHS

(75) Inventors: Chunbo Liu, San Jose, CA (US); Zhijian Ma, San Jose, CA (US); Jeong Yeol Choi, Palo Alto, CA (US)

(73) Assignee: Integrated Device Technology, Inc., Santa Clara, CA (US)

( * ) Notice: Subject to any disclaimer, the term of this patent is extended or adjusted under 35 U.S.C. 154(b) by 0 days.

(21) Appl. No.: 09/465,433

(22) Filed: Dec. 21, 1999

(51) Int. Cl.$^7$ ............................................. G06F 17/50
(52) U.S. Cl. ...................................................... 703/14
(58) Field of Search ............................................ 703/14

(56) References Cited

U.S. PATENT DOCUMENTS

| | | | | |
|---|---|---|---|---|
| 4,658,367 A | * | 4/1987 | Potter | 702/111 |
| 5,481,485 A | * | 1/1996 | Takeuchi | 703/14 |
| 5,693,178 A | | 12/1997 | Chan et al. | 156/627.1 |
| 5,698,902 A | | 12/1997 | Uehara et al. | 257/773 |
| 5,783,101 A | | 7/1998 | Ma et al. | 216/68 |
| 5,843,847 A | | 12/1998 | Pu et al. | 438/723 |
| 5,883,007 A | | 3/1999 | Abraham et al. | 438/714 |
| 5,917,205 A | | 6/1999 | Mitsui et al. | 257/202 |
| 5,930,677 A | | 7/1999 | Zheng et al. | 438/782 |
| 5,933,356 A | | 8/1999 | Rostoker et al. | 364/489 |
| 6,174,741 B1 | * | 1/2001 | Hansch et al. | 438/14 |
| 6,246,973 B1 | * | 6/2001 | Sekine | 703/4 |
| 6,278,964 B1 | * | 8/2001 | Fang et al. | 703/19 |
| 6,553,340 B1 | * | 4/2003 | Kumashiro | 703/14 |

OTHER PUBLICATIONS

Joo–Sun Choi, In–Sool Chung, "A Test Structure for Monitoring Micro–Loading Effect of MOSFET Gate Length", IEEE 1996, pp. 3–7.*

Cheng–Liang Huang, John V. Faricelli, Dimitri A. Antoniadis, Nadim A. Khalil, Rafael A. Rios, "An Accurate Gate Length Extraction Method for Sub–Quarter Micron MOSFETs", IEEE 1996, pp. 958–964.*

Y. Taur, D.S. Zichermann, D.R. Lombardi, P. J. Restle, C.H. Hsu, H. I. Hanafi, M. R. Worderman, B. Davari, G. G. Shahidi; A New "Shift and Ratio" Method for MOSFET Channel–Length Extraction, IEEE 1992, pp. 267–269.*

Dolainsky et al., *Evaluation of Resist Models for Fast Optical Proximity Correction*, SPIE, vol. 3236, 1998, pp. 202–207.

Cook et al., *Dose, Shape, and Hybrid Modification for PYRAMID in Electron Beam Proximity Effect Correction*, J. Vac. Sci. Technol. B, 15(6), Nov./Dec. 1997, pp. 2303–2308.

Schroder, Dieter K., "Semiconductor Material and Device Characterization," John Wiley & Sons, Inc., 1990, pp. 2–5.

Liu et al., "An Electrical Technique for Determining MOSFET Gate Length Reduction Due to Process Micro–loading Effects in Advanced CMOS Technology," Proc. IEEE Int. Conference on Microelectronic Test Structures, Mar. 2000, pp. 118–121.

* cited by examiner

*Primary Examiner*—Kevin J. Teska
*Assistant Examiner*—Dwin M. Craig
(74) *Attorney, Agent, or Firm*—Myers Bigel Sibley & Sajovec

(57) ABSTRACT

Methods, apparatus and computer program products for modeling integrated circuits having dense devices therein that experience linewidth (e.g., gate electrodes) reductions during fabrication are provided. For dense devices having electrical paths therein and first and second gate electrodes that overlie the electrical path, operations include determining an electrical gate length of the first gate electrode by evaluating a change in current through the electrical path relative to a change in gate length of the second gate electrode. The operation to determine the electrical gate length of the first gate electrode includes evaluating a change in simulated drain-to-source current through the electrical path relative to a change in the electrical gate length of the second gate electrode.

20 Claims, 11 Drawing Sheets

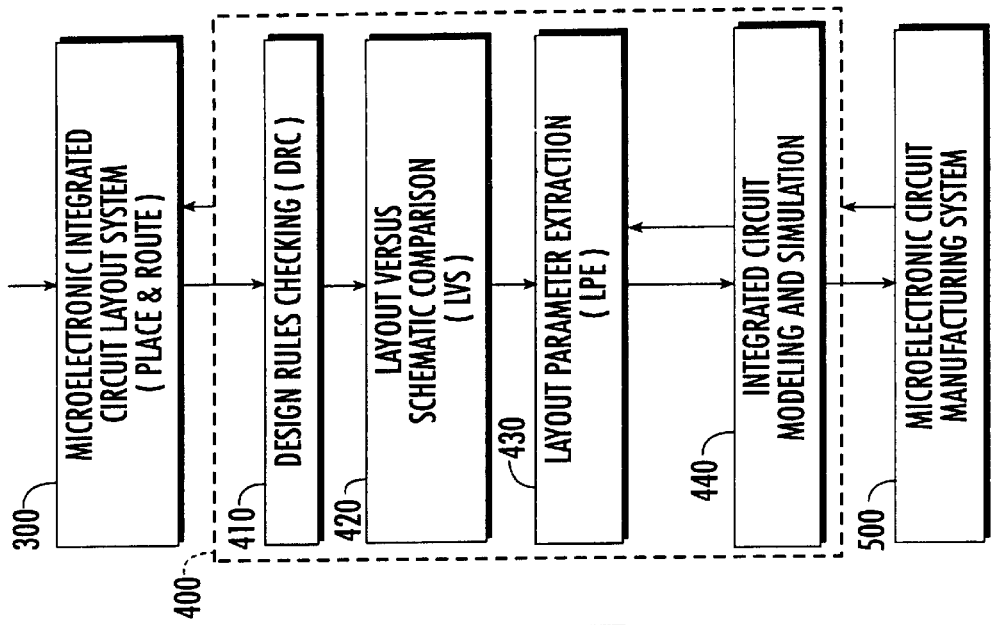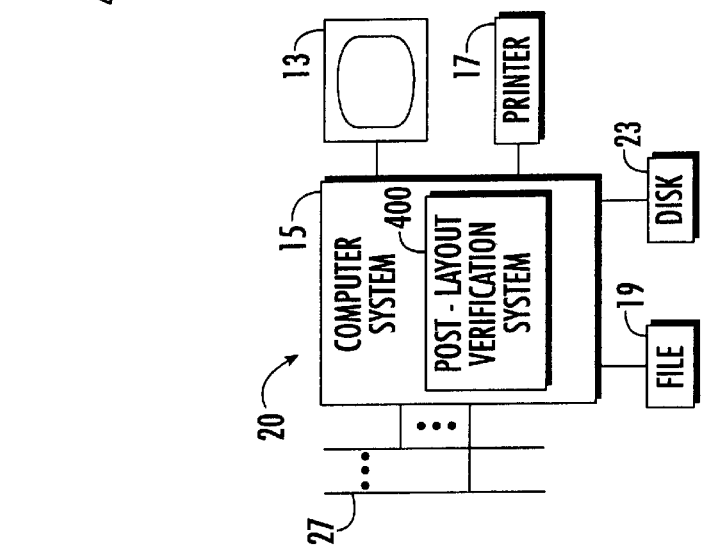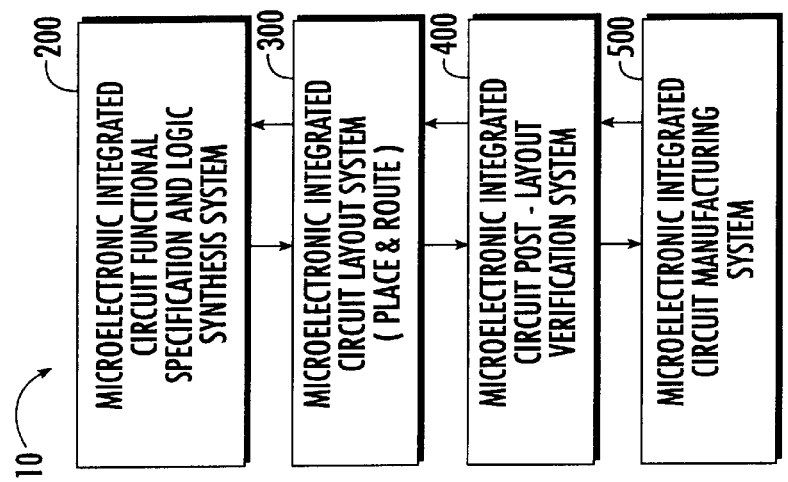

EXAMPLE (f)
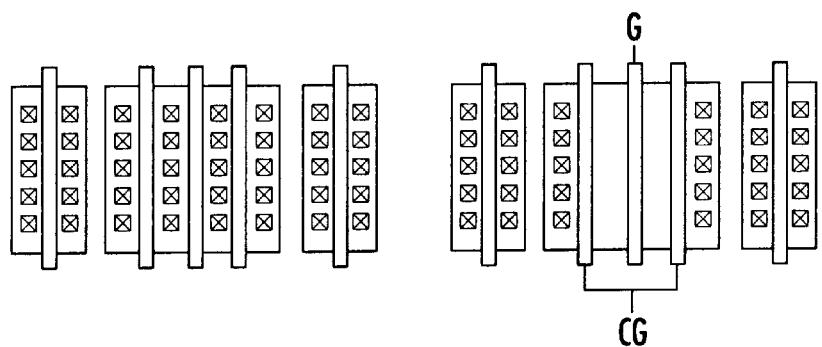
EXAMPLE (g)
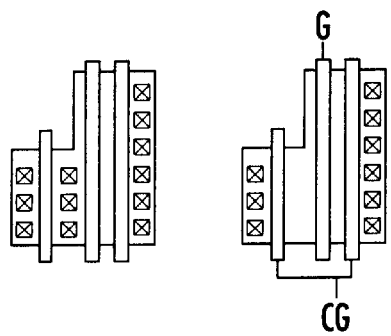
EXAMPLE (h)
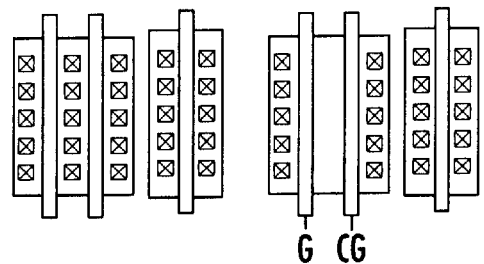
EXAMPLE (i)
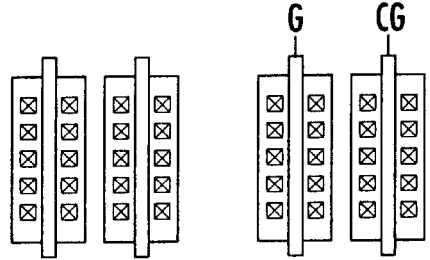
G = GATE
CG = CONTROL GATE
EXAMPLE (j)
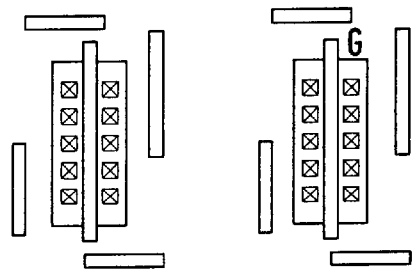
*FIG. 10.*

METHODS, APPARATUS AND COMPUTER PROGRAM PRODUCTS FOR MODELING INTEGRATED CIRCUIT DEVICES HAVING REDUCED LINEWIDTHS

FIELD OF THE INVENTION

This invention relates to the design, layout, testing and manufacture of microelectronic circuits and systems, and more particularly to apparatus, methods and computer program products for verifying microelectronic circuits and systems prior to manufacture.

BACKGROUND OF THE INVENTION

It is generally known that in current state-of-the-art integrated circuit technologies, fabricated linewidths are frequently smaller than drawn linewidths. For example, it is generally known that in CMOS technologies, the linewidths of fabricated polysilicon gate electrodes may be considerable smaller than their respective drawn linewidths. This gate length reduction is particularly noticeable in dense areas of an integrated circuit where the micro-loading or proximity effects from etch, photo and mask making steps are significant. As will be understood by those skilled in the art, these effects translate into reductions in MOSFET gate lengths in logic circuits such as NAND, NOR and MUX where polysilicon gate electrodes are typically laid out side-by-side at closely adjacent locations (i.e., in a dense manner) as multi-gate field effect transistors. These effects may also become more pronounced and have more impact on circuit speeds and driving capability as CMOS and other technologies continue to be scaled downward. Traditional techniques to account for these effects have included Optical Proximity Correction (OPC) and various schemes have been proposed to physically compensate for the linewidth reductions caused by microloading effects. Such schemes are described in articles by B. D. Cook, entitled "Dose, Shape, and Hybrid Modifications for Pyramid in Electron Beam Proximity Effect Correction", J. Vac. Sci. Technol. B, Vol. 15, No. 6, pp. 2303–2308, November/December (1997) and C. Dolainsky et al., entitled "Evaluation of Resist Models for Fast Optical Proximity Correction", Proc. SPIE, Vol. 3236, pp. 202–207 (1998).

Unfortunately, micro-loading effects typically cannot be completely corrected for because severe linewidth reductions may occur during subsequent fabrication and back-end processing steps (i.e., after OPC). Thus, notwithstanding conventional attempts to account for micro-loading or proximity effects, there continues to be a need for improved methods of determining linewidth reductions (e.g., gate length reductions) that can address the additional causes of micro-loading.

SUMMARY OF THE INVENTION

It is therefore an object of the present invention to provide improved methods, apparatus and computer program products for determining the extent to which drawn linewidths of an integrated circuit schematic are reduced when the integrated circuit is fabricated.

It is also an object of the present invention to provide methods, apparatus and computer program products for more accurately modeling multi-gate field effect transistors.

These and other objects, features and advantages can be provided by methods, apparatus and computer program products for modeling integrated circuits having dense devices therein that experience linewidth (e.g., gate electrode) reductions during fabrication. In particular, for dense devices having electrical paths therein and first and second gate electrodes that overlie the electrical path, preferred operations include determining an electrical gate length of the first gate electrode by evaluating a change in current through the electrical path relative to a change in gate length of the second gate electrode. This operation to determine an electrical gate length of the first gate electrode preferably comprises determining an electrical gate length of the first gate electrode (L1) by evaluating a change in simulated drain-to-source current ($IDS_{sim}$) through the electrical path relative to a change in an electrical gate length of the second gate electrode (L2). For example, determining L1 preferably comprises determining $\partial IDS_{sim}/\partial L2$ and $\partial IDS_{sim}/\partial L1$ from the simulated drain-to-source current, where "$\partial$" denotes a partial derivative.

The preferred operations also include determining I–V characteristics of the device based on measured drain-to-source current ($IDS_{measured}$) through the electrical path and determining L1 by solving $x_1=(\partial IDS_{sim}/\partial L2)/(\partial IDS_{sim}/\partial L1)$ and determining when $\partial E(\Delta L1, \Delta L2)/\partial \Delta L1=0$, where $E(\Delta L1, \Delta L2)$ is a square error function that equals $\Sigma(\Delta L1+x_{1k}\Delta L2-y_k)^2$, for all integers k ranging from 1 to N, where N is the number of data points in the simulated drain-to-source current $IDS_{sim}$, $y_k=(IDS_{measured}-IDS_{sim})/(\partial IDS_{sim}/\partial L1)|_k$, and $\Delta L1$ and $\Delta L2$ are gate length reductions for the first and second gate electrodes, respectively. Measurements of actual drain-to-source current can be achieved by measuring dense devices formed on modeling or test chips that can be fabricated side-by-side on a wafer with functional integrated circuit chips containing identical dense devices. By providing actual dense devices that can be measured and modeled individually after fabrication (or at least after most fabrication steps have been performed), more complete assessments of the causes of microloading can be achieved and the models derived therefrom can be used to more accurately represent the performance of active devices within functional integrated circuit chips.

According to another embodiment of the present invention, operations to model a multi-gate field effect transistor include measuring current through an actual drain-to-source path of the multi-gate field effect transistor at a plurality of actual drain-to-source voltages and simulating current through a simulated drain-to-source path of the multi-gate field effect transistor at a plurality of simulated drain-to-source voltages. Operations are also performed to determine a first derivative of the simulated current with respect to a gate length of a first gate electrode of the multi-gate field effect transistor and determine a second derivative of the simulated current with respect to a gate length of a second gate electrode of the multi-gate field effect transistor. Then the electrical gate lengths of the first and second gate electrodes are found by determining, based on the first derivative and the second derivative, a least squares fit between the measured current and the simulated current. These electrical gate lengths accurately account for the process-induced gate line reductions that occur during fabrication of an integrated circuit.

According to preferred aspects of this embodiment, the operations to measure current comprise operations to measure the I–V characteristics of the multi-gate field effect transistor with all but a first of the gate electrodes therein held at respective fixed control voltages. To achieve higher degrees of accuracy, the operations to simulate current also preferably include simulating current through a simulated drain-to-source path of the multi-gate field effect transistor at a plurality of simulated drain-to-source voltages of a first polarity and also at a plurality of simulated drain-to-source voltages of a second polarity opposite the first polarity.

According to yet another embodiment of the present invention, operations to model a multi-gate field effect transistor include determining a square error function E(ΔL1, ΔL2, . . . , ΔLn), where n is the number of gate electrodes in the multi-gate field effect transistor and ΔLn is the gate length reduction associated with the nth gate electrode. Gate length reductions can then be determined from the square error function by solving for when ∂E/∂ΔL1, ∂E/∂ΔL2, . . . , and ∂E/∂ΔLn all equal zero. According to this embodiment of the present invention, the square error function for a field effect transistor having n gate electrodes can be expressed as:

$$E = \sum_{k=1}^{N} (\Delta L1 + \bar{x}_{1k}\Delta L2 + \ldots + \bar{x}_{(n-1)k}\Delta Ln - \bar{y}_k)^2.$$

In the case where n=3, the operations to determine the gate length reductions comprise determining when the following equations are simultaneously satisfied:

$$N\Delta L1 + \sum_{k=1}^{N} \bar{x}_{1k}\Delta L2 + \sum_{k=1}^{N} \bar{x}_{2k}\Delta L3 = \sum_{k=1}^{N} \bar{y}_k,$$

$$\sum_{k=1}^{N} \bar{x}_{1k}\Delta L1 + \sum_{k=1}^{N} \bar{x}_{1k}^2\Delta L2 + \sum_{k=1}^{N} (\bar{x}_{1k}\bar{x}_{2k})\Delta L3 = \sum_{k=1}^{N} (\bar{x}_{1k}\bar{y}_{1k}),$$

$$0 + \sum_{k=1}^{N} \Delta x_{1k}\Delta L2 + \sum_{k=1}^{N} \Delta x_{2k}\Delta L3 = \sum_{k=1}^{N} \Delta y_k.$$

BRIEF DESCRIPTION OF THE DRAWINGS

FIG. 1 illustrates a functional block diagram of microelectronic integrated circuit synthesis, layout, verification and manufacturing tools according to the present invention.

FIG. 2 illustrates a general hardware description of post-layout verification tools according to the present invention.

FIG. 3 illustrates general operations performed by post-layout verification tools, methods and computer program products according to the present invention.

DETAILED DESCRIPTION OF PREFERRED EMBODIMENTS

Figure 4:
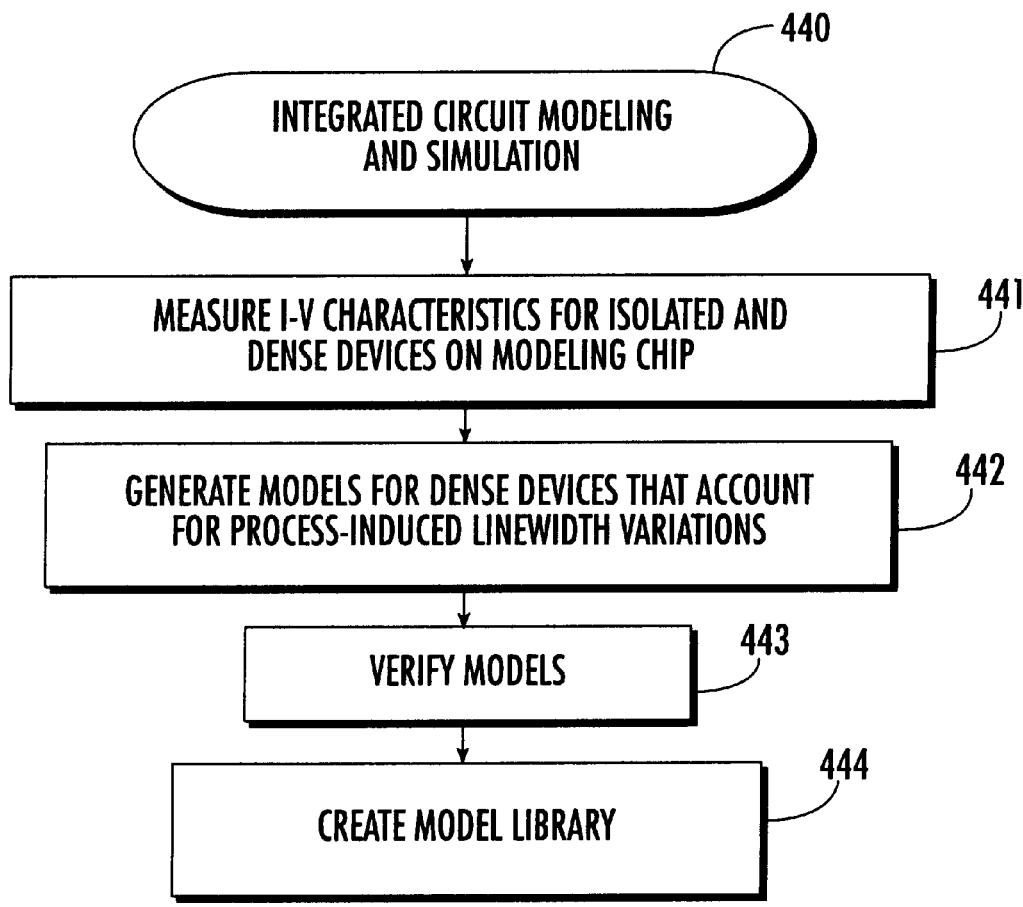
FIG. 4 illustrates operations performed by integrated circuit modeling and simulation tools, methods and computer program products according to the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Referring now to FIG. 1, operations performed by a preferred computer aided microelectronic integrated circuit synthesis, layout, verification and manufacturing system 10 will be generally described. The system may include four general subsystems: an integrated circuit functional specification and logic synthesis system 200, an integrated circuit layout system 300, a post-layout verification system 400 and an integrated circuit manufacturing system 500. The microelectronic integrated circuit functional specification and logic synthesis system 200 may include circuit libraries or macros for such elements as logic gates, flip-flops, registers, memory elements, drivers and buffers, for example. The functional specification and logic synthesis system 200 typically provides a vehicle for generating and displaying an electrical schematic of an integrated circuit and producing a computer readable representation of the schematic as a design netlist. The microelectronic integrated circuit layout system 300 typically provides a vehicle for generating a physical layout by placing and routing an electrical circuit schematic generated by the functional specification and logic synthesis system 200. A wiring program may also be provided with the layout system 300 for automatically determining the placement of the wiring interconnect nets between active device elements within the microelectronic integrated circuit.

A verification system 400 is also preferably provided for performing an independent verification of the physical layout to ensure compliance with the requirements of the functional specification and logic synthesis system 200 as well as the manufacturing system 500. Accordingly, the verification system 400 is typically referred to as a "post-layout" verification system and is typically employed near the end of the design process. In addition to acting as an independent verification of the operability and correctness of the layout of the circuit design, the verification system 400 may provide means by which changes and optimizations can be performed. As will be understood by those skilled in the art, various other types of analyses such as timing analysis and circuit/logic simulation may be performed to check whether the specifications and requirements of the first two subsystems 200 and 300 are satisfied. After verification, the physical layout is forwarded to the manufacturing system 500 to produce the integrated circuit. The microelectronic circuit manufacturing system 500 may generate the required masks, and may control the manufacturing tools necessary to fabricate the integrated circuit on a semiconductor wafer, for example. The manufacturing system 500 may also generate a "modeling chip" from which critical modeling parameters can be derived. These additional modeling parameters can then be used by the functional specification and logic synthesis system 200 and post-layout verification system 400, as described more fully hereinbelow.

It will be understood by those having skill in the art that the integrated circuit functional specification and logic synthesis system 200, microelectronic circuit layout system 300 and various parts of the microelectronic integrated circuit manufacturing system 500 may be realized in whole or in part as software modules running on a computer system. Alternatively, a dedicated stand-alone system with application specific integrated circuits for performing the above described functions may be provided. The general design and operation of the functional specification and logic synthesis system 200, layout system 300 and manufacturing system 500 are well known to those having a skill in the art and need not be described further herein.

Referring now to FIG. 2, a general hardware description of a computer workstation containing, among other things, the integrated circuit post-layout verification system 400 of FIG. 1 will be described. As shown by FIG. 2, the workstation 20 preferably includes a computer 15 containing a post-layout verification software sub-system 400 running thereon. The post-layout verification system 400 may accept a computer representation of the electrical schematic and layout of an integrated circuit via a file 19, disk input 23 or data bus 27. A display 13 and printer 17 are also preferably provided to assist in verifying the layout and design of the integrated circuit. The hardware design of the above described components 13, 17, 19, 27 and 23 is well known to those having skill in the art and need not be described further herein. As one example, the post-layout verification system 400 may be installed on a computer system such as a SPARC 5 workstation manufactured by Sun Microsystems Computer Corporation (see, http://www.sun.com).

Referring now to FIG. 3, there is illustrated a general overview of operations that are preferably performed by the post-layout verification system 400 of the present invention. In particular, the post-layout verification system 400 is illustrated as performing four (4) operations 410–440. For the sake of clarity, these operations are illustrated and described as discrete operations, however, in practice many of these operations may be combined and performed in parallel. Additional operations may also be performed by the post-layout verification system 400. The first operation 410 is performed by a design rule checking (DRC) tool which runs comprehensive hierarchical design rule checks on a geometric database containing the physical layout of an integrated circuit to be verified. The operations performed by the design rule checking tool include, among other things, checking for area, grid, length, size, spacing, corner, enclosure, intersection and overlap errors, for example. The second operation 420 is performed by a preferred hierarchical layout versus schematic (LVS) tool which extracts a hierarchical netlist from the geometric layout database and compares it to the electrical schematic netlist. Layout and schematic logic agreement is then verified at hierarchical matching points, for example.

The third operation 430 is performed by a layout parameter extraction (LPE) tool. This tool may, among other things, perform an initial operation of modeling each of a plurality of interconnect nets within the integrated circuit layout in order to obtain estimates of the parasitic resistance and capacitance of the nets. Once this layout parameter extraction operation 430 is complete, modeling and simulation operations 440 are performed as described more fully hereinbelow with respect to FIGS. 4–11. The results obtained from these modeling and simulation operations may also be passed back to the layout parameter extraction tool 430. For example, the modeling and simulation operations may be performed on a test or modeling chip so that a model library of active devices can be established. This model library may then be used by the extraction tool when integrated circuits are being verified by the post-layout verification system 400. As illustrated by the reverse upward sequence of arrows in FIGS. 1 and 3, the performance of post-layout verification may necessitate redesign of the integrated circuit by the functional specification and logic synthesis system 200 and/or modifying the physical layout using the layout system 300. Finally, in the event the integrated circuit is verified for design rule compliance and the layout versus schematic (LVS) comparison and modeling and simulation operations yield acceptable results, the physical layout is forwarded to the manufacturing system 500 to produce the integrated circuit.

The operations of the present invention, as described more fully hereinbelow, may be performed by an entirely hardware embodiment, an entirely software embodiment or an embodiment combining software and hardware aspects. Furthermore, the present invention may take the form of a computer program product on a computer-readable storage medium having computer-readable program code embodied in the medium. Any suitable computer-readable medium may be utilized including hard disks, CD-ROMs or other optical or magnetic storage devices.

Figure 8:
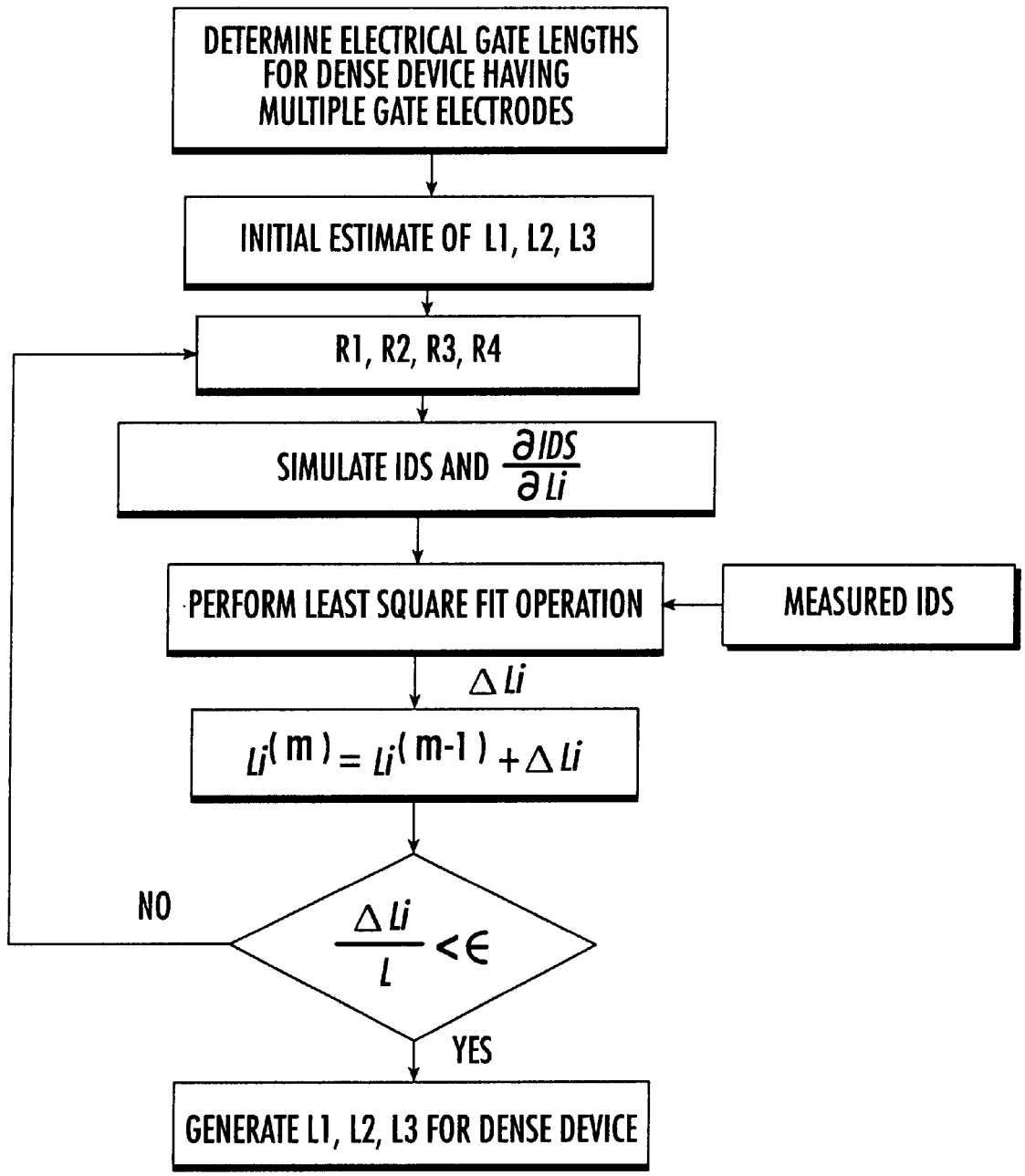
FIG. 8 illustrates preferred operations to determine the electrical gate lengths for the exemplary dense device of FIGS. 5 and 7A.

Additional operations performed by various aspects of the present invention are illustrated in more detail in FIGS. 4 and 8, which are flowchart illustrations. It will be understood that one or more blocks of the flowchart illustrations may be implemented by computer program instructions. These computer program instructions may be provided to a processor or other programmable data processing apparatus to produce a machine, such that the instructions which execute on the processor or other programmable data processing apparatus create means for implementing the functions specified in the flowchart block or blocks. These computer program instructions may also be stored in a computer-readable memory that can direct a processor or other programmable data processing apparatus to function in a particular manner.

Referring now to FIGS. 4 to 11, operations 440 performed by a preferred integrated circuit modeling and simulation tool will now be described. In particular, Block 441 illustrates operations to measure I–V characteristics for isolated and dense devices on a modeling chip and/or isolated and dense devices on modeling portions of an integrated circuit chip designed to perform one or more predetermined functions (e.g., memory chip). Typical isolated devices include a field effect transistor having a single gate electrode extending opposite a respective "island" within a semiconductor substrate. This gate electrode, which may comprise polycrystalline silicon, constitutes an "isolated" gate electrode if process-induced gate length reductions (caused by microloading or proximity effects from etch, photo and mask masking steps) do not occur or are insignificant to the electrical characteristics of the isolated device. In contrast, "dense" devices typically include a field effect transistor having multiple side-by-side gate electrodes extending opposite a respective island within a semiconductor substrate. These gate electrodes constitute "dense" gate electrodes if process-induced gate length reductions occur and are significant to the resulting I–V characteristics of the device. Dense devices may also include field effect transistors having single gate electrodes if adjacent devices or structures are sufficiently close in proximity to cause significant micro-loading.

Referring next to Block 442, models for the isolated and dense devices are then generated. As described more fully hereinbelow, these models are developed to accurately account for process-induced linewidth variations (e.g., gate length reductions). The models are then verified in a preferred manner, Block 443, and then the verified models are stored in a model library, Block 444. This model library may be used by the above-described specification and logic synthesis system 200 and layout parameter extraction tool 430, for example.

Figure 5:
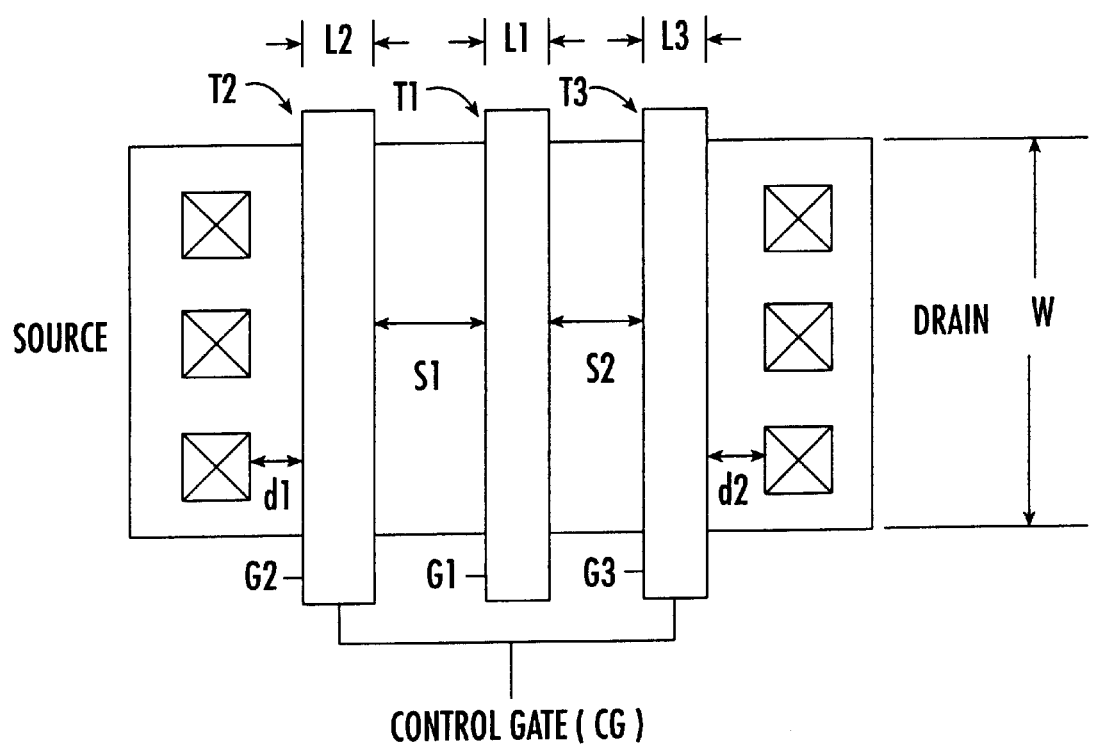
FIG. 5 is a plan layout view of an exemplary dense device that can be modeled in accordance with the present invention.

Referring again to Block 441 of FIG. 4, preferred operations to define a modeling chip and measure I–V characteristics for isolated and dense devices will now be described. In particular, as illustrated by FIG. 5, the gate electrodes of an exemplary dense device, which typically comprise polysilicon, have the same drawn gate length L and extend opposite a respective "island" (e.g., active region) that has a width W and defines a source-to-drain electrical path. The central first gate electrode G1 is spaced from the second and third gate electrodes G2 and G3 by spacing distances S1 and S2. The distance between the second gate electrode G2 and the source contacts is defined as d1 and the distance between the third gate electrode G3 and the drain contacts is defined as d2, as illustrated. To achieve accurate modeling, the second and third gate electrodes G2 and G3 are electrically connected together and collectively form a control gate electrode CG that receives a fixed control voltage. Alternatively, each of the second and third gate electrodes G2 and G3 may receive respective control voltages that are different. For an NMOS type device, the control voltage is preferably a logic 1 voltage (e.g., Vdd). Because micro-loading influences are a function of the length, width, spacing, orientation, etc. of the gate electrodes G1, G2 and G3 and other closely adjacent elements and devices, a substantial variety of dense devices should be provided on a modeling chip, as illustrated more fully hereinbelow with respect to FIG. 10. In particular, the design of the modeling chip should be sufficient to provide accurate modeling of microloading effects in a realistic circuit environment containing many active devices.

Figure 6A:
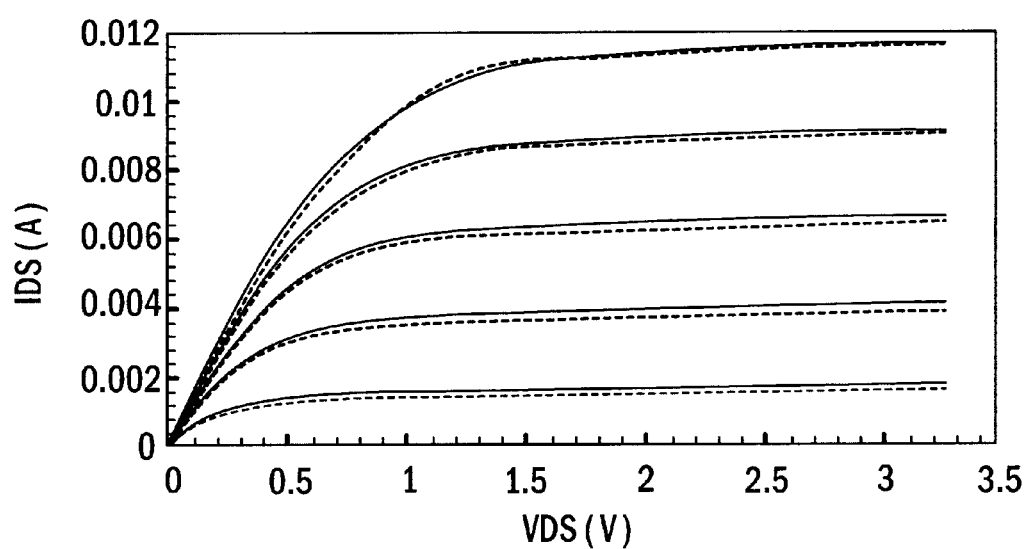
FIG. 6A illustrates simulated and measured IDS v. VDS characteristics for an isolated single-gate MOSFET.
Figure 6B:
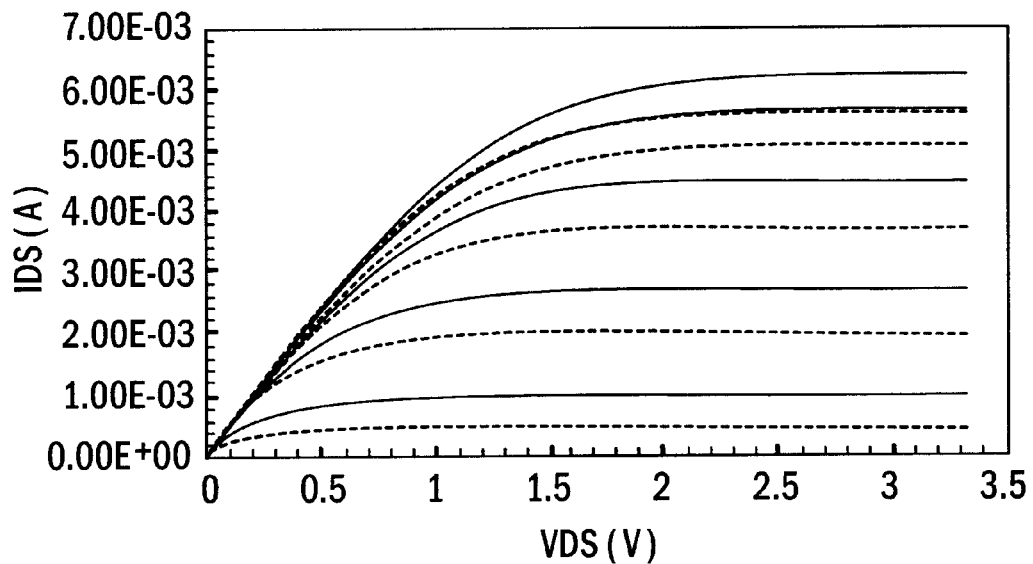
FIG. 6B illustrates simulated and measured IDS v. VDS characteristics for a dense multi-gate MOSFET when no correction for gate length reduction is made to account for micro-loading effects.

The I–V characteristics of a plurality of isolated and essentially "micro-loading free" devices (e.g., MOSFETs) having varying gate lengths, widths, orientation, etc., are then measured on the modeling chip. From these measurements, accurate models (e.g., SPICE models) of the isolated devices can be extracted using conventional parametric extraction techniques well known to those skilled in the art. The accuracy of these SPICE models can then be confirmed for each isolated device. For example, FIG. 6A illustrates simulated and measured IDS v. VDS characteristics for an isolated single-gate MOSFET having a drawn gate length L. The solid line represents measured data and the dashed lines are derived from simulation. The accuracy of the model of the isolated device can be confirmed by verifying whether the error between the measured and simulated characteristics is sufficiently small. This verification operation may also confirm that no gate length reduction is necessary since the isolated device is essentially "micro-loading free".

Figure 7A:
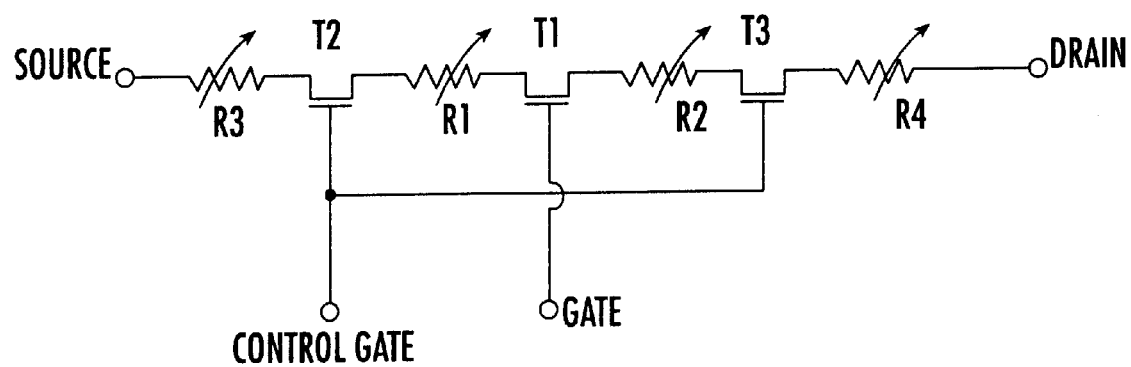
FIG. 7A is an equivalent circuit schematic that can be used to model the dense device of FIG. 5 in accordance with the present invention.
Figure 7B:
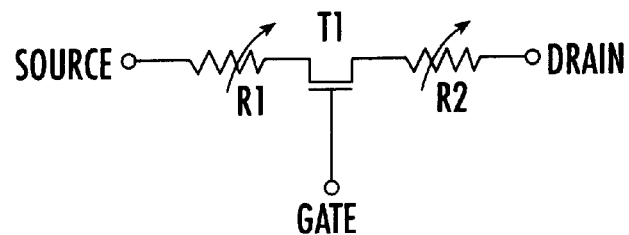
FIG. 7B is an equivalent circuit schematic that can be used to model a dense device having a single gate electrode.

The I–V characteristics for each of the dense devices are then measured by, among other things, applying a constant voltage (e.g., power supply voltage Vdd) to the designated control gate electrode (CG) and applying various gate voltages to the independent gate electrode, such as G1 in the dense device of FIG. 5. The I–V characteristics are measured in order to obtain relationships between $IDS_{measured}$ v. $VDS_{measured}$ for each of a plurality of gate electrode voltages $V_{G1}$ (i.e., a family of characteristic I–V curves). Referring now to FIG. 7A, an equivalent circuit schematic which can be used to model the dense device of FIG. 5 is illustrated. This equivalent circuit schematic comprises three separate MOSFETs electrically connected in series, as illustrated. Because a significant influence of micro-loading is the reduction in gate length (e.g., poly gate length), different gate lengths are assigned to the transistors in FIG. 7A even though the drawn gate length of each transistor is the same. The middle transistor T1 has a gate electrode G1 with an electrical gate length of LI. The source-side transistor T2 has a gate electrode G2 with an electrical gate length of L2 and the drain-side transistor T3 has a gate electrode G3 with an electrical gate length of L3.

An extracted SPICE model is next used to simulate the I–V characteristics of the equivalent circuit of FIG. 7A, and thereby determine for each of a plurality of gate voltages applied to the first gate electrode G1 (and with $V_{G2}$ and $V_{G3}$ set to the power supply potential Vdd), the simulated drain-to-source current $IDS_{sim}$ at various simulated drain-to-source voltages $VDS_{sim}$. Thus, the extracted SPICE model is used to simulate a family of characteristic I–V curves. As illustrated by the IDS v. VDS graph of FIG. 6B, when no correction for gate length reduction is made to account for micro-loading effects, the simulated drain-to-source current $IDS_{sim}$ of the dense device of FIGS. 5 and 7A (dotted lines) is significantly lower than the measured drain-to-source current $IDS_{measured}$ (solid lines), even though the channel resistance provided by transistors T2 and T3 and the source/drain series resistances R1–R4 are correctly accounted for in the simulation of the extracted SPICE model. As illustrated by the layout examples (e), (f), (h), (i) and (j) of FIG. 10 described more fully hereinbelow, similar discrepancies in measured and simulated I–V characteristics may also apply to "dense" devices having only a single gate electrode. To address micro-loading influences on these types of dense devices having only a single gate electrode, the equivalent circuit schematic of FIG. 7B may also be used in the above-described operations to determine simulated I–V characteristics. As will be understood by those skilled in the art, simpler dense devices that can be modeled by the equivalent circuit schematic of FIG. 7B may also be modeled using conventional techniques. Such conventional techniques may include the generation of repeated guesses of the gate lengths for dense devices having only single gates followed by modeling based on these guesses until a sufficient match is achieved between measured and simulated I–V characteristics.

Referring now to Block 442 of FIG. 4, preferred operations for generating accurate models of dense devices that account for process-induced linewidth variations will now be described. These operations preferably include the application of a least squares algorithm to find the "electrical" gate lengths of gate electrodes within multi-gate and single gate dense devices. As will be understood by those skilled in the art, the electrical gate length of a device is the "effective" gate length that accurately determines the device's electrical characteristics. The electrical gate length may differ somewhat from a device's measured gate length after processing, particularly if the length of the gate or its edge profile in uneven. A flow diagram of high-level operations performed by this algorithm is illustrated by FIG. 8. In particular, FIG. 8 illustrates preferred operations to determine the electrical gate lengths for the exemplary dense device of FIGS. 5 and 7A. These operations begin with a determination of an initial estimate of the electrical gate lengths L1, L2 and L3, for a given d1, d2, S1, S2 and drawn gate length L. Based on these initial estimates, the source/drain series resistances R1–R4 may be determined based on the following relationships:

$$R1 = RSH(S1 + \Delta L1/2 + \Delta L2/2)/W$$

$$R2 = RSH(S2 + \Delta L1/2 + \Delta L3/2)/W \quad (1)$$

$$R3 = RSH(d1 + \Delta L2/2)/W$$

$$R4 = RSH(d2 + \Delta L3/2)/W$$

where RSH is the source/drain sheet resistance and $\Delta Li$ (i=1,2,3 ...) are the gate length reductions for transistors T1, T2 and T3 in the equivalent circuit. A simulation (e.g., SPICE simulation) of the drain-to-source current ($IDS_{sim}$) as a function of, among other things, the electrical gate lengths Li (i=1,2,3 ...) is then determined along with a calculation of a first order derivative of $IDS_{sim}$ with respect to Li (i.e., $\partial IDS_{sim}/\partial Li$). As will be understood by those skilled in the art, values of $IDS_{sim}$ are also a function of the gate voltages and the drain-to-source voltages ($VDS_{sim}$).

Referring still to FIG. 8, a linear least square fit operation is then performed using these simulation results and calculations and measured I–V characteristics including $IDS_{measured}$. In the linear least square fit operation, differences between the simulated and measured drain-to-source current IDS are preferably linearized as:

$$IDS_{meas} - IDS_{sim} = (\partial IDS_{sim}/\partial L1)\Delta L1 + (\partial IDS_{sim}/\partial L2)\Delta L2 + (\partial IDS_{sim}/\partial L3)\Delta L3 \quad (2)$$

Dividing both sides of equation (2) by $\partial IDS_{sim}/\partial L1$ and defining "y" as $(IDS_{meas} - IDS_{sim})/(\partial IDS_{sim}/\partial L1)$, $x_1$ as $(\partial IDS_{sim}/\partial L2)/(\partial IDS_{sim}/\partial L1)$ and $x_2$ as $(\partial IDS_{sim}/\partial L3)/(\partial IDS_{sim}/\partial L1)$, yields the following relationship:

$$y = \Delta L1 + \Delta L2 x_1 + \Delta L3 x_2 \quad (3)$$

Based on equation (3), a square error function can be written as:

$$E(\Delta L1, \Delta L2, \Delta L3) = \sum_{k=1}^{N} (\Delta L1 + \Delta L2 x_{1k} + \Delta L3 x_{2k} - y_k)^2 \quad (4)$$

where N is the number of data points in the IDS v. VDS family of curves that are used in the linear least square fit operation. In order for the square error function to have a minimum, the following relationships should be satisfied:

$$\frac{\partial E}{\partial \Delta L1} = \sum_{k=1}^{N} (\Delta L1 + \Delta L2 x_{1k} + \Delta L3 x_{2k} - y_k) = 0 \quad (5.1)$$

$$\frac{\partial E}{\partial \Delta L2} = \sum_{k=1}^{N} (\Delta L1 x_{1k} + \Delta L2 x_{1k}^2 + \Delta L3 x_{1k} x_{2k} - x_{1k} y_k) = 0 \quad (5.2)$$

$$\frac{\partial E}{\partial \Delta L3} = \sum_{k=1}^{N} (\Delta L1 x_{2k} + \Delta L2 x_{1k} x_{2k} + \Delta L3 x_{2k}^2 - x_{2k} y_k) = 0 \quad (5.3)$$

These relationships should allow $\Delta L1$, $\Delta L2$ and $\Delta L3$ to be uniquely determined. Referring still to FIG. 8, the gate lengths $Li^{(m)}$ after the $m^{th}$ iteration is then given by:

$$Li^{(m)} = Li^{(m-1)} + \Delta Li \quad (6)$$

where $Li^{(m-1)}$ is the gate length recorded after the $(m-1)^{th}$ iteration. As illustrated by FIG. 8, these sequence of operations are repeated continuously in an iterative manner until the change in the gate length is smaller than a predetermined value "$\epsilon$". If this condition is satisfied, the gate lengths L1, L2 and L3 are determined and operations illustrated by FIG. 8 are complete.

Figure 6C:
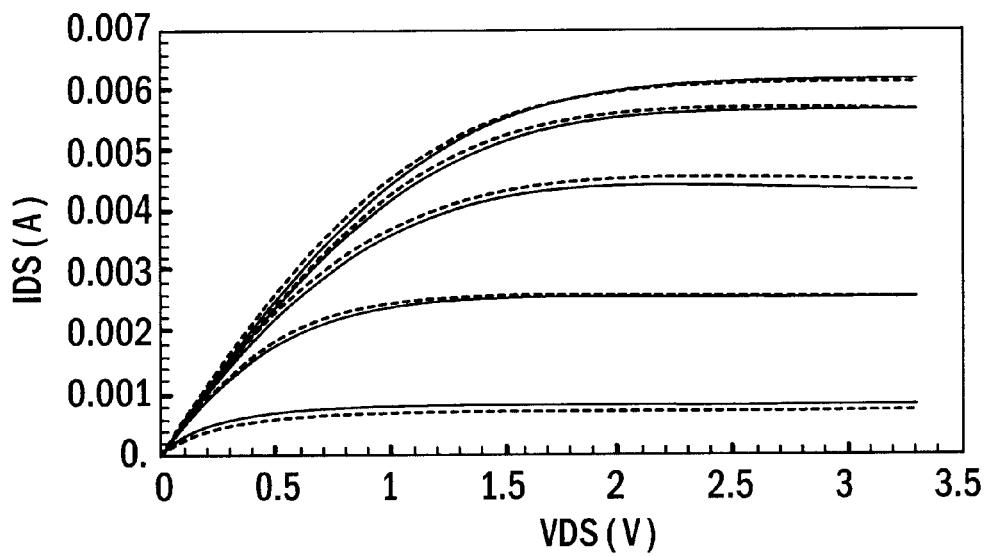
FIG. 6C illustrates simulated and measured IDS v. VDS characteristics for a dense multi-gate MOSFET when correction for gate length reduction is made in accordance with the present invention.

As illustrated by FIG. 6C and Block 443 of FIG. 4, a comparison of simulated drain-to-source current $IDS_{sim}$ (with L1, L2 and L3 found in accordance with the above-described operations) and measured drain-to-source current $IDS_{measured}$ is performed to verify the accuracy of the model of the dense device. In particular, FIG. 6C shows that good fitting accuracy is achieved because correct gate lengths are assigned to all three transistors T1, T2 and T3 in FIG. 7A. However, because of the location dependence of the micro-loading effect, the central and two neighboring polysilicon gate electrodes of the dense device of FIG. 5 experience different gate length reductions. For example, in the exemplary device of FIGS. 5 and 7A, the central gate electrode is determined to be 20.7% narrower than the isolated polysilicon gate electrode having the same drawn gate length, while the two neighboring gate electrodes G2 and G3 are only 6.5% and 5.9% narrower. The reason the preferred technique is able to automatically extract the location dependence of the micro-loading effect is because the current in the exemplary dense device is determined by at least two factors: the gate length of T1 and the channel resistances of T2 and T3 which are determined by the gate lengths of T2 and T3.

In order to improve the accuracy of the models of the dense devices even further, the above-described operations should be performed again with the polarity of VDS switched. Performing the operations again with a switched VDS is advantageous because the influence of T2 (or T3) in FIG. 7A depends on which side T2 (or T3) is located (i.e., source side or drain side). Because neither side is entirely representative, an average effect should be considered.

Using a switched VDS polarity, equation (3) above can be rewritten as follows:

$$y' = \Delta L1 + \Delta L2 x_1' + \Delta L3 x_2' \quad (7)$$

By adding equations (3) and (7) together and defining $\bar{x}_1 = (x_1 + x_1')/2$, $\bar{x}_2 = (x_2 + x_2')/2$ and $\bar{y} = (y + y')/2$, the above equations (3)–(5.3) can be rewritten as follows:

$$\bar{y} = \Delta L1 + \Delta L2 \bar{x}_1 + \Delta L3 \bar{x}_2 \quad (8)$$

$$E = \sum_{k=1}^{N} (\Delta L1 + \bar{x}_{1k} \Delta L2 + \bar{x}_{2k} \Delta L3 - \bar{y}_k)^2 \quad (9)$$

$$\frac{\partial E}{\partial \Delta L1} = \sum_{k=1}^{N} (\Delta L1 + \bar{x}_{1k} \Delta L2 + \bar{x}_{2k} \Delta L3 - \bar{y}_k) = 0 \quad (10.1)$$

-continued $$\frac{\partial E}{\partial \Delta L2} = \sum_{k=1}^{N} (\bar{x}_{1k}\Delta L1 + \bar{x}_{1k}^2 \Delta L2 + \bar{x}_{1k}\bar{x}_{2k}\Delta L3 - \bar{x}_{1k}\bar{y}_{1k}) = 0 \quad (10.2)$$

$$\frac{\partial E}{\partial \Delta L3} = \sum_{k=1}^{N} (\bar{x}_{2k}\Delta L1 + \bar{x}_{1k}\bar{x}_{2k}\Delta L2 + \bar{x}_{2k}^2 \Delta L3 - \bar{x}_{2k}\bar{y}_{k}) = 0 \quad (10.3)$$

Accordingly, by switching the polarity of VDS, the relationships of equations (10.1)–(10.3) allow ΔL1, ΔL2 and ΔL3 to be more accurately determined through iteration.

Notwithstanding the high level of accuracy of the above described operations, equations (10.1)–(10.3) may on some limited occasions provide erroneous results for ΔL2 and ΔL3 (although ΔL1 is typically still correct), even though the above equations are mathematically correct. This possibility of error is due to the fact that the illustrated least squares technique requires the function y of equation (8) to be sufficiently sensitive to the variations of ΔL1, ΔL2 and ΔL3. However, because ΔL2 and ΔL3 may frequently be about equal because they experience similar micro-loading effects, the variables $x_1$ and $x_2$ may also be about equal and, accordingly, equations (10.2) and (10.3) may become similar. In fact, because ΔL3 equals ΔL2+s, where s is the difference between ΔL3 and ΔL2 and is very small, the least squares technique can become essentially a technique to find ΔL1, ΔL2 and s. But, because the function y of equation (8) may not be sufficiently sensitive to s, the use of equations (10.1)–(10.3) may fail to yield sufficiently accurate results in some limited circumstances.

To address this potential limitation on accuracy, equation (3) is preferably subtracted, from equation (7) and the following relationships are defined: $\Delta y = y - y'$, $\Delta x_1 = x_1 - x_1'$, $\Delta x_2 = x_2 - x_2'$. Using these relationships, the following equation can be derived:

$$\Delta y = \Delta x_1 \Delta L2 + \Delta x_2 \Delta L3 \quad (11)$$

Because this equation (11) can be used to replace equation (10.3), the following set of equations can be used to more accurately determine ΔL1, ΔL2 and ΔL3 in situations where s is small:

$$N\Delta L1 + \sum_{k=1}^{N}\bar{x}_{1k}\Delta L2 + \sum_{k=1}^{N}\bar{x}_{2k}\Delta L3 = \sum_{k=1}^{N}\bar{y}_{k} \quad (12.1)$$

$$\sum_{k=1}^{N}\bar{x}_{1k}\Delta L1 + \sum_{k=1}^{N}\bar{x}_{1k}^2\Delta L2 + \sum_{k=1}^{N}(\bar{x}_{1k}\bar{x}_{2k})\Delta L3 = \sum_{k=1}^{N}(\bar{x}_{1k}\bar{y}_{k}) \quad (12.2)$$

$$0 + \sum_{k=1}^{N}\Delta x_{1k}\Delta L2 + \sum_{k=1}^{N}\Delta x_{2k}\Delta L3 = \sum_{k=1}^{N}\Delta y_{k} \quad (12.3)$$

A solution of equations (12.1)–(12.3) to determine ΔL1, ΔL2 and ΔL3 may be best illustrated by performing the operations of FIG. 8 on the device of FIGS. 5 and 7A having a drawn gate length of 0.28 μm for all gates and initial estimates of electrical gate length of L1=0.26 μm (center), L2=0.27 μm (left side) and L3=0.28 μm (right side). The results of these operations are illustrated by TABLE 1, where the number of data points N equals thirty (30) (for each VG1, |VDS|=0.5, 1.0, 1.5, 2.0, 2.5, 3V).

TABLE 1

| VG | |VDS| | $x_1$ | $x'_1$ | $x_2$ | $x'_2$ | y | y' | $\bar{x}_1$ | $\bar{x}_2$ |
|---|---|---|---|---|---|---|---|---|---|
| 0.9 | 0.5 | 0.027443 | 0.001918 | 0.001916 | 0.027172 | −0.04781 | −0.04853 | 0.014681 | 0.014544 |
| 0.9 | 1 | 0.028576 | 0.001976 | 0.001978 | 0.028288 | −0.05099 | −0.05175 | 0.015276 | 0.015133 |
| 0.9 | 1.5 | 0.029372 | 0.003582 | 0.003617 | 0.029073 | −0.05146 | −0.0522 | 0.016477 | 0.016345 |
| 0.9 | 2 | 0.029976 | 0.012881 | 0.0133 | 0.029678 | −0.05171 | −0.05224 | 0.021429 | 0.021489 |
| 0.9 | 2.5 | 0.030154 | 0.037668 | 0.034561 | 0.029877 | −0.05333 | −0.05351 | 0.033911 | 0.032219 |
| 0.9 | 3 | 0.030185 | 0.040655 | 0.037139 | 0.029912 | −0.05361 | −0.05374 | 0.03542 | 0.033525 |
| 1.5 | 0.5 | 0.167123 | 0.114754 | 0.115068 | 0.164845 | −0.01728 | −0.01835 | 0.140939 | 0.139957 |
| 1.5 | 1 | 0.123532 | 0.021527 | 0.02144 | 0.121989 | −0.03103 | −0.03265 | 0.07253 | 0.071714 |
| 1.5 | 1.5 | 0.119852 | 0.019526 | 0.019898 | 0.11855 | −0.03421 | −0.03582 | 0.069689 | 0.069224 |
| 1.5 | 2 | 0.118251 | 0.034915 | 0.03436 | 0.116831 | −0.03622 | −0.03763 | 0.076583 | 0.075595 |
| 1.5 | 2.5 | 0.118246 | 0.047492 | 0.044287 | 0.116289 | −0.03734 | −0.03859 | 0.082869 | 0.080288 |
| 1.5 | 3 | 0.117777 | 0.049956 | 0.046758 | 0.116269 | −0.0375 | −0.03873 | 0.083866 | 0.081513 |
| 2.1 | 0.5 | 0.405594 | 0.422006 | 0.420979 | 0.401114 | −0.0022 | −0.00317 | 0.4138 | 0.411047 |
| 2.1 | 1 | 0.301874 | 0.272366 | 0.27577 | 0.296223 | −0.02377 | −0.02473 | 0.28712 | 0.285996 |
| 2.1 | 1.5 | 0.235268 | 0.107394 | 0.112982 | 0.231074 | −0.02766 | −0.02943 | 0.171331 | 0.172028 |
| 2.1 | 2 | 0.22449 | 0.099227 | 0.101224 | 0.220415 | −0.03095 | −0.03276 | 0.161859 | 0.16082 |
| 2.1 | 2.5 | 0.222938 | 0.10313 | 0.103421 | 0.219101 | −0.03197 | −0.03375 | 0.163034 | 0.161261 |
| 2.1 | 3 | 0.222133 | 0.103544 | 0.103476 | 0.21824 | −0.03203 | −0.03379 | 0.162839 | 0.160858 |
| 2.7 | 0.5 | 0.665392 | 0.754286 | 0.749522 | 0.660952 | 0.004522 | 0.003616 | 0.709839 | 0.705237 |
| 2.7 | 1 | 0.568569 | 0.732673 | 0.72973 | 0.560396 | −0.02856 | −0.0282 | 0.650621 | 0.645063 |
| 2.7 | 1.5 | 0.492754 | 0.729078 | 0.731884 | 0.48227 | −0.04057 | −0.03877 | 0.610916 | 0.607077 |
| 2.7 | 2 | 0.45907 | 0.823194 | 0.827767 | 0.446768 | −0.04749 | −0.0437 | 0.641132 | 0.637267 |
| 2.7 | 2.5 | 0.450411 | 0.825716 | 0.834491 | 0.436319 | −0.05003 | −0.04585 | 0.638063 | 0.635405 |
| 2.7 | 3 | 0.445129 | 0.816835 | 0.831689 | 0.430943 | −0.04963 | −0.04527 | 0.630982 | 0.631316 |
| 3.3 | 0.5 | 0.922892 | 1.074519 | 1.06506 | 0.915865 | 0.004403 | 0.003542 | 0.998705 | 0.990463 |
| 3.3 | 1 | 0.854839 | 1.204787 | 1.193548 | 0.844415 | −0.03861 | −0.03703 | 1.029813 | 1.018982 |
| 3.3 | 1.5 | 0.797906 | 1.437243 | 1.416754 | 0.787037 | −0.06058 | −0.05554 | 1.117574 | 1.101895 |
| 3.3 | 2 | 0.772636 | 1.816306 | 1.762575 | 0.759332 | −0.08108 | −0.07146 | 1.294471 | 1.260954 |
| 3.3 | 2.5 | 0.765978 | 1.891555 | 1.830875 | 0.753359 | −0.08936 | −0.07873 | 1.328767 | 1.292117 |
| 3.3 | 3 | 0.763285 | 1.925612 | 1.864734 | 0.748588 | −0.09099 | −0.07983 | 1.344449 | 1.306661 |
| | Σ | 10.51164 | 15.52632 | 15.3308 | 10.34118 | −1.21904 | −1.18862 | 13.01898 | 12.83599 |

| VG | |VDS| | $\bar{y}$ | $\Delta x_1$ | $\Delta x_2$ | $\Delta y$ | $\bar{x}_1\bar{x}_2$ | $\bar{x}_1^2$ | $\bar{x}_2^2$ | $\bar{x}_1\bar{y}$ |
|---|---|---|---|---|---|---|---|---|---|
| 0.9 | 0.5 | −0.04817 | 0.025525 | −0.02526 | 0.000719 | 0.000214 | 0.000216 | 0.000212 | −0.00071 |
| 0.9 | 1 | −0.05137 | 0.0266 | −0.02631 | 0.000763 | 0.000231 | 0.000233 | 0.000229 | −0.00078 |

TABLE 1-continued

| | | | | | | | | | |
|---|---|---|---|---|---|---|---|---|---|
| 0.9 | 1.5 | −0.05183 | 0.025791 | −0.02546 | 0.00074 | 0.000269 | 0.000271 | 0.000267 | −0.00085 |
| 0.9 | 2 | −0.05197 | 0.017095 | −0.01638 | 0.000539 | 0.00046 | 0.000459 | 0.000462 | −0.00111 |
| 0.9 | 2.5 | −0.05342 | −0.00751 | 0.004684 | 0.000184 | 0.001093 | 0.00115 | 0.001038 | −0.00181 |
| 0.9 | 3 | −0.05368 | −0.01047 | 0.007227 | 0.000134 | 0.001187 | 0.001255 | 0.001124 | −0.0019 |
| 1.5 | 0.5 | −0.01782 | 0.052369 | −0.04978 | 0.001072 | 0.019725 | 0.019864 | 0.019588 | −0.00251 |
| 1.5 | 1 | −0.03184 | 0.102005 | −0.10055 | 0.001617 | 0.005201 | 0.005261 | 0.005143 | −0.00231 |
| 1.5 | 1.5 | −0.03502 | 0.100326 | −0.09865 | 0.001616 | 0.004824 | 0.004857 | 0.004792 | −0.00244 |
| 1.5 | 2 | −0.03693 | 0.083336 | −0.08247 | 0.001406 | 0.005789 | 0.005865 | 0.005715 | −0.00283 |
| 1.5 | 2.5 | −0.03796 | 0.070754 | −0.072 | 0.001254 | 0.006653 | 0.006867 | 0.006446 | −0.00315 |
| 1.5 | 3 | −0.03811 | 0.067821 | −0.06951 | 0.001233 | 0.006836 | 0.007034 | 0.006644 | −0.0032 |
| 2.1 | 0.5 | −0.00268 | −0.01641 | 0.019865 | 0.000972 | 0.170091 | 0.17123 | 0.168959 | −0.00111 |
| 2.1 | 1 | −0.02425 | 0.029508 | −0.02045 | 0.000955 | 0.082115 | 0.082438 | 0.081794 | −0.00696 |
| 2.1 | 1.5 | −0.02854 | 0.127874 | −0.11809 | 0.001775 | 0.029474 | 0.029354 | 0.029594 | −0.00489 |
| 2.1 | 2 | −0.03186 | 0.125262 | −0.11919 | 0.001813 | 0.02603 | 0.026198 | 0.025863 | −0.00516 |
| 2.1 | 2.5 | −0.03286 | 0.119808 | −0.11568 | 0.001785 | 0.026291 | 0.02658 | 0.026005 | −0.00536 |
| 2.1 | 3 | −0.03291 | 0.118589 | −0.11476 | 0.001761 | 0.026194 | 0.026517 | 0.025875 | −0.00536 |
| 2.7 | 0.5 | 0.004069 | −0.08889 | 0.08857 | 0.000905 | 0.500605 | 0.503871 | 0.497359 | 0.002888 |
| 2.7 | 1 | −0.02838 | −0.1641 | 0.169334 | −0.00036 | 0.419691 | 0.423308 | 0.416106 | −0.01847 |
| 2.7 | 1.5 | −0.03967 | −0.23632 | 0.249615 | −0.0018 | 0.370873 | 0.373218 | 0.368542 | −0.02423 |
| 2.7 | 2 | −0.04559 | −0.36412 | 0.380999 | −0.0038 | 0.408573 | 0.41105 | 0.40611 | −0.02923 |
| 2.7 | 2.5 | −0.04794 | −0.37531 | 0.398172 | −0.00419 | 0.405429 | 0.407125 | 0.40374 | −0.03059 |
| 2.7 | 3 | −0.04745 | −0.37171 | 0.400747 | −0.00436 | 0.398349 | 0.398138 | 0.39856 | −0.02994 |
| 3.3 | 0.5 | 0.003972 | −0.15163 | 0.149195 | 0.000861 | 0.989181 | 0.997412 | 0.981017 | 0.003967 |
| 3.3 | 1 | −0.03782 | −0.34995 | 0.349133 | −0.00158 | 1.049361 | 1.060515 | 1.038324 | −0.03895 |
| 3.3 | 1.5 | −0.05806 | −0.63934 | 0.629717 | −0.00504 | 1.23145 | 1.248972 | 1.214174 | −0.06489 |
| 3.3 | 2 | −0.07627 | −1.04367 | 1.003243 | −0.00962 | 1.632268 | 1.675656 | 1.590004 | −0.09873 |
| 3.3 | 2.5 | −0.08405 | −1.12558 | 1.077516 | −0.01063 | 1.716922 | 1.765621 | 1.669566 | −0.11168 |
| 3.3 | 3 | −0.08541 | −1.16233 | 1.116147 | −0.01116 | 1.756738 | 1.807542 | 1.707363 | −0.11483 |
| | Σ | −1.20383 | −5.01468 | 4.989623 | −0.03042 | 11.29212 | 11.48808 | 11.10061 | −0.60712 |

Using the results of TABLE 1 and rewriting equations (12.1)–(12.3) in matrix form yields:

$$\begin{pmatrix} 30 & 13.01898 & 12.83599 \\ 13.01898 & 11.48808 & 11.29212 \\ 0 & -5.01468 & 4.989623 \end{pmatrix} \begin{pmatrix} \Delta L1 \\ \Delta L2 \\ \Delta L3 \end{pmatrix} = \begin{pmatrix} -1.20383 \\ -0.90712 \\ -0.03042 \end{pmatrix} \quad (13)$$

The solution of the matrix equation (13) provides ΔL1=−0.033805, ΔL2=−0.004301 and ΔL3=−0.010415. Therefore, based on the initial estimates, the electrical gate lengths are: L1=0.26−0.033805, L2=0.27−0.004301 and L3=0.28–0.010415.

Figure 9:
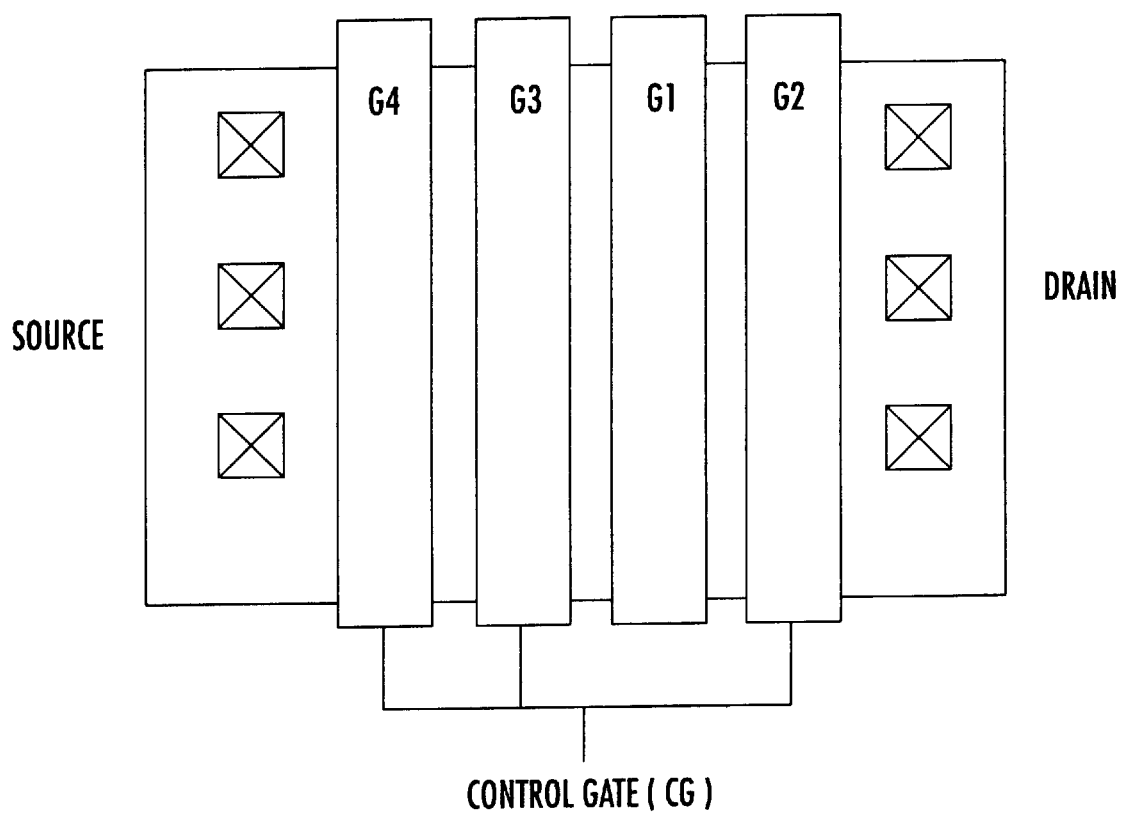
FIG. 9 is a plan layout view of another exemplary dense device that can be modeled in accordance with the present invention.
Figure 10:
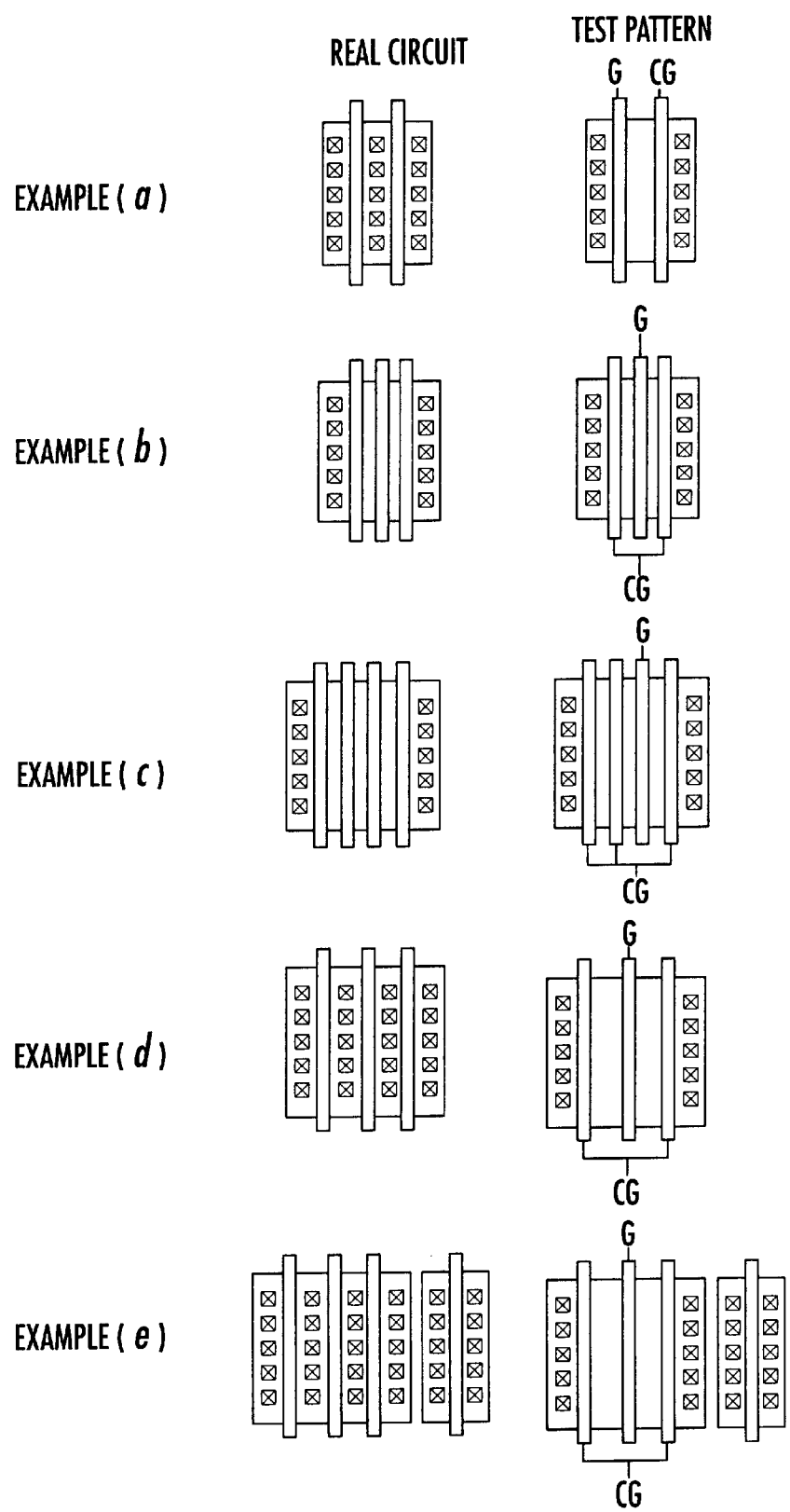
FIG. 10 illustrates plan layout views of exemplary dense devices that can be modeled in accordance with the present invention.

As will be understood by those skilled in the art, the above described operations may be applied to numerous other dense devices, such as those illustrated by FIGS. 9 and 10. For example, as illustrated by FIG. 9, a dense device having four gate electrodes may be evaluated by simply rewriting equations (8) and (9) to account for the additional gate electrode:

$$\bar{y} = \Delta L1 + \Delta L2\bar{x}_1 + \Delta L3\bar{x}_2 + \Delta L4\bar{x}_3 \quad (14)$$

$$E = \sum_{k=1}^{N} (\Delta L1 + \bar{x}_{1k}\Delta L2 + \bar{x}_{2k}\Delta L3 + \bar{x}_{3k}\Delta L4 - \bar{y}_k)^2 \quad (15)$$

and then determining when the square error function of equation (15) has a minimum.

Referring again to FIG. 4, the above-described operations may be performed on a plurality of dense devices in order to create a model library, Block 444. For example, a computer-controlled semiconductor parameter analyzer, such as a Hewlett-Packard HP4155 analyzer, may be used to analyze each gate pattern (e.g., poly pattern) on a modeling chip and determine therefrom the appropriate gate length reduction. A model library demonstrating micro-loading effects may then be generated from the analysis of the gate patterns on the modeling chip. This model library may then be used when an integrated circuit device (e.g., memory device) is evaluated by a post-layout verification tool. As will be understood by those skilled in the art, this library may be linked to any existing CAD tools such as Avantl's HERCULES™ verification software or Cadence's DRACULA™ verification software. In particular, using the built-in pattern recognition capabilities offered by these tools, dense devices can be identified and proper gate length reductions can be made automatically. Pattern-dependent and location-dependent gate length reduction capability can also be implemented in a SPICE netlist extraction tool using the concept of a "micro-loading" library.

FIG. 10 demonstrates the concept of building a "micro-loading" library, where the left side of examples (a)–(j) shows various dense poly patterns typically encountered in an integrated circuit and the right side of examples (a)–(j) shows the modeling test patterns that can be used to represent the corresponding dense patterns. More specifically, examples (a), (b), (c), (d) and (g) illustrate parallel gates (e.g., poly gates) on a single island. All the devices in this category can be treated like the dense device of FIG. 5 with the number of gates varying from two to four or more. Another common feature of this category is that all gates but one are treated as control gates during simulation. Examples (e), (e and (h) illustrates parallel gates on separate islands. The choice of which gates are treated as control gates (CG) depends on which gates are being modeled. If one of the gates on the large island is treated as the primary gate (G), the equivalent circuit becomes that of FIG. 7A, however, if a single gate on a small island is treated as the primary gate (G), then the equivalent circuit becomes that of FIG. 7B. Finally, example (i) illustrates a pair of single gate transistors formed in respective side-by-side islands and example (j) illustrates a single gate on a single island that is surrounding by dummy poly patterns which may represent interconnect patterns in an integrated circuit. In these examples, the equivalent circuit becomes that of FIG. 7B.

Figure 11:
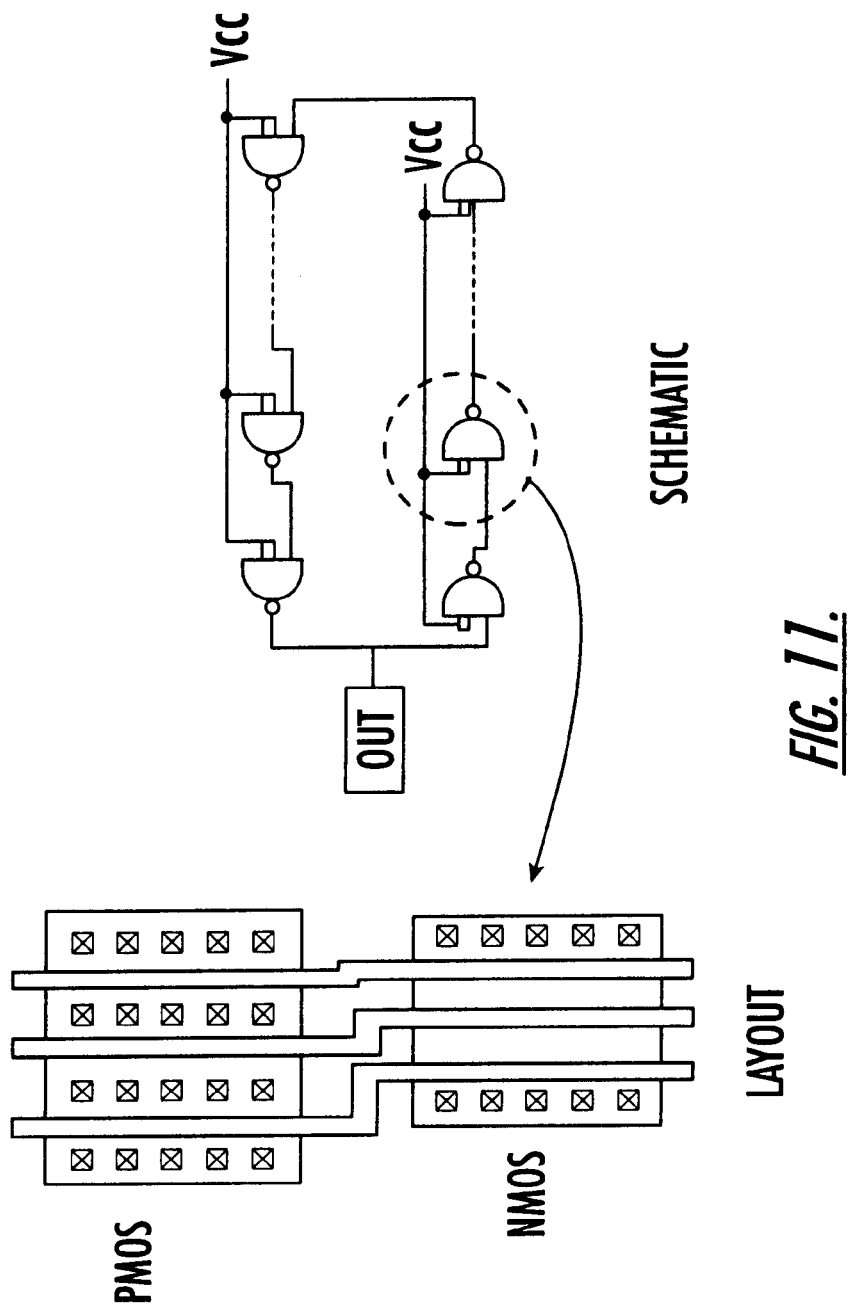
FIG. 11 illustrates a plan layout view and electrical schematic of a ring oscillator that can be used to verify the accuracy of models of dense devices.

The above-described model verification operations may also include the use of simple delay circuits formed on the modeling chip. These delay circuits are preferably constructed to have dense poly gate patterns and can be used to verify the gate length reductions extracted from the dense devices. For example, as illustrated by FIG. 11, ring oscillators consisting of inverters (fan out=3), NOR gates or the illustrated NAND gates may be used to verify the accuracy of the determined gate length reductions. As illustrated by TABLE 2, the simulated per stage delay is compared to measurement. The simulated speeds are 18.1 % too slow for NAND and 18.5% too slow for NOR without considering the actual gate length reductions. However, with gate lengths properly adjusted, simulation and actual measurement are very close.

TABLE 2

| Ring Type | Measured delay (ps/stage) | Simulation w/o gate length reduction | Simulation w/gate length reduction |
|---|---|---|---|
| Inverter (F.O. = 3) | 75.2 | 73.5 (−2.3%) | 73.5 (−2.3%) |
| NAND | 82.7 | 97.7 (+18.1%) | 85.03 (+2.8%) |
| NOR | 127.3 | 150.8 (+18.5%) | 125.6 (−1.3%) |

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of modeling an integrated circuit device having an electrical path therein and first and second gate electrodes that overlie the electrical path, comprising the steps of:

determining an electrical gate length of the first gate electrode by determining a simulated drain-to-source current ($IDS_{sim}$) through the electrical path; and determining an electrical gate length of the first gate electrode (L1) by:

evaluating a change in the simulated drain-to-source current ($IDS_{sim}$) through the electrical path relative to a change in an electrical gate length of the second gate electrode (L2) as $\partial IDS_{sim}/\partial L2$; and evaluating a change in the simulated drain-to-source current ($IDS_{sim}$) through the electrical path relative to a change in an electrical gate length of the first gate electrode as $\partial IDS_{sim}/\partial L1$.

2. The method of claim 1, further comprising the step of determining I–V characteristics of the device based on measured drain-to-source current ($IDS_{measured}$) through the electrical path; and wherein said step of determining L1 comprises the steps of determining $x_1=(\partial IDS_{sim}/\partial L2)/(\partial IDS_{sim}/\partial L1)$ and determining when $\partial E(\Delta L1, \Delta L2)/\partial \Delta L1 = 0$, where $E(\Delta L1, \Delta L2)$ is a square error function that equals $\Sigma(\Delta L1 + x_{1k}\Delta L2 - y_k)^2$, for all integer k ranging from 1 to N, where N is the number of data points in the simulated drain-to-source current $IDS_{sim}$, $y_k = (IDS_{measured} - IDS_{sim})/(\partial IDS_{sim}/\partial L1)|_k$, and $\Delta L1$ and $\Delta L2$ are gate length reductions for the first and second gate electrodes, respectively.

3. A method of modeling a multi-gate field effect transistor, comprising the steps of:

measuring current through an actual drain-to-source path of the multi-gate field effect transistor at a plurality of actual drain-to-source voltages;

simulating current through a simulated drain-to-source path of the multi-gate field effect transistor at a plurality of simulated drain-to-source voltages;

determining a first derivative of the simulated current with respect to a gate length of a first gate electrode of the multi-gate field effect transistor and a second derivative of the simulated current with respect to a gate length of a second gate electrode of the multi-gate field effect transistor; and determining electrical gate lengths of the first and second gate electrodes by determining, based on the first derivative and the second derivative, a least squares fit between the measured current and the simulated current; and wherein said step of measuring current comprises measuring I–V characteristics of the multi-gate field effect transistor with all but a first of the gate electrodes therein held at respective fixed control voltages.

4. The method of claim 3, wherein said simulating step comprises simulating I–V characteristics of the multi-gate field effect transistor with all but a first of the gate electrodes therein held at respective fixed control voltages.

5. A method of modeling a multi-gate field effect transistor, comprising the steps of:

measuring current through an actual drain-to-source path of the multi-gate field effect transistor at a plurality of actual drain-to-source voltages;

simulating current through a simulated drain-to-source path of the multi-gate field effect transistor at a plurality of simulated drain-to-source voltages;

determining a first derivative of the simulated current with respect to a gate length of a first gate electrode of the multi-gate field effect transistor and a second derivative of the simulated current with respect to a gate length of a second gate electrode of the multi-gate field effect transistor; and determining electrical gate lengths of the first and second gate electrodes by determining, based on the first derivative and the second derivative, a least squares fit between the measured current and the simulated current; and wherein said simulating step comprises simulating current through a simulated drain-to-source path of the multi-gate field effect transistor at a plurality of simulated drain-to-source voltages of a first polarity and at a plurality of simulated drain-to-source voltages of a second polarity opposite the first polarity.

6. A method of generating a library of integrated circuit device models, comprising the steps of:

measuring I–V characteristics of a dense device having a plurality of gate electrodes;

generating from the measured I–V characteristics and a model of an isolated field effect transistor, an electrical model of the dense device that accounts for process-induced gate length reductions to the plurality of gate electrodes; and verifying the electrical model of the dense device using a ring oscillator that comprises a plurality of the dense devices.

7. A method of generating a library of integrated circuit device models, comprising the steps of:

measuring I–V characteristics of a dense device having a plurality of gate electrodes; and generating from the measured I–V characteristics and a model of an isolated field effect transistor, an electrical model of the dense device that accounts for process-induced gate length reductions to the plurality of gate electrodes, by:

simulating I–V characteristics of the dense device to determine a simulated drain-to-source current ($IDS_{sim}$) therein; and evaluating a square error function that varies in response to changes in $IDS_{sim}$ relative to changes in lengths of the plurality of gate electrodes;

wherein said evaluating step comprises determining the values of the gate length reductions that minimize the square error function.

8. A method of generating a library of integrated circuit device models, comprising the steps of:

measuring I–V characteristics of a dense device having a plurality of gate electrodes; and generating from the measured I–V characteristics and a model of an isolated field effect transistor, an electrical model of the dense device that accounts for process-induced gate length reductions to the plurality of gate electrodes, by:

simulating I–V characteristics of the dense device to determine a simulated drain-to-source current ($IDS_{sim}$) therein; and evaluating a square error function that varies in response to changes in $IDS_{sim}$ relative to changes in lengths of the plurality of gate electrodes;

wherein said simulating step comprises maintaining all but one of the plurality of gate electrodes at a single control voltage or at respective control voltages while varying the voltage of the one gate electrode.

9. The method of claim 7, wherein said simulating step comprises maintaining all but one of the plurality of gate electrodes at a single control voltage or at respective control voltages while varying the voltage of the one gate electrode.

10. A method of modeling a multi-gate field effect transistor, comprising the steps of:

determining a square error function $E(\Delta L1, \Delta L2, \ldots, \Delta Ln)$, where n is the number of gate electrodes in the multi-gate field effect transistor and $\Delta Ln$ is the gate length reduction associated with the nth gate electrode; and determining the gate length reductions for the n gate electrodes of the multi-gate field effect transistor by determining when $\partial E/\partial \Delta L1$, $\partial E/\partial \Delta L2$, ..., and $\partial E/\partial \Delta Ln$ all equal zero;

wherein n equals three; and wherein the square error function is defined as:

$$E = \sum_{k=1}^{N}(\Delta L1 + \bar{x}_{1k}\Delta L2 + \bar{x}_{2k}\Delta L3 - \bar{y}_k)^2.$$

11. The method of claim 10, wherein said step of determining the gate length reductions comprises determining when the following equations are simultaneously satisfied:

$$N\Delta L1 + \sum_{k=1}^{N} x_{1k}\Delta L2 + \sum_{k=1}^{N} x_{2k}\Delta L3 = \sum_{k=1}^{N} y_k,$$

$$\sum_{k=1}^{N} x_{1k}\Delta L1 + \sum_{k=1}^{N} x_{1k}^2 \Delta L2 + \sum_{k=1}^{N} (x_{1k}x_{2k})\Delta L3 = \sum_{k=1}^{N}(x_{1k}y_k),$$

$$0 + \sum_{k=1}^{N} \Delta x_{1k}\Delta L2 + \sum_{k=1}^{N} \Delta x_{2k}\Delta L3 = \sum_{k=1}^{N} \Delta y_k.$$

12. The method of claim 10, wherein said step of determining the gate length reductions comprises determining when the following equations are simultaneously satisfied:

$$\frac{\partial E}{\partial \Delta L2} = \sum_{k=1}^{N}(\Delta L1 + \bar{x}_{1k}\Delta L2 + \bar{x}_{2k}\Delta L3 - \bar{y}_k) = 0,$$

$$\frac{\partial E}{\partial \Delta L2} = \sum_{k=1}^{N}(\bar{x}_{1k}\Delta L1 + \bar{x}_{1k}^2 \Delta L2 + \bar{x}_{1k}\bar{x}_{2k}\Delta L3 - \bar{x}_{1k}\bar{y}_k) = 0,$$

$$\frac{\partial E}{\partial \Delta L3} = \sum_{k=1}^{N}(\bar{x}_{2k}\Delta L1 + \bar{x}_{1k}\bar{x}_{2k}\Delta L2 + \bar{x}_{2k}^2 \Delta L3 - \bar{x}_{2k}\bar{y}_k) = 0.$$

13. A computer program product that is configured to model a multi-gate field effect transistor, said product comprising a computer readable storage medium having computer-readable program code embodied in said medium, said computer-readable program code comprising:

computer-readable program code that, when executed, determines a square error function $E(\Delta L1, \Delta L2, \ldots, \Delta Ln)$, where n is the number of gate electrodes in the multi-gate field effect transistor and $\Delta Ln$ is the gate length reduction associated with the nth gate electrode; and computer-readable program code that, when executed, determines the gate length reductions for the n gate electrodes of the multi-gate field effect transistor by determining when $\partial E/\partial \Delta L1$, $\partial E/\partial \Delta L2$, ..., and $\partial E/\partial \Delta Ln$ all equal zero;

wherein n equals three; and wherein the square error function is defined as:

$$E = \sum_{k=1}^{N}(\Delta L1 + \bar{x}_{1k}\Delta L2 + \bar{x}_{2k}\Delta L3 - \bar{y}_k)^2.$$

14. The computer program product of claim 13, wherein said computer-readable program code that determines the gate length reductions comprises computer-readable program code that, when executed, determines when the following equations are simultaneously satisfied:

$$N\Delta L1 + \sum_{k=1}^{N} \bar{x}_{1k}\Delta L2 + \sum_{k=1}^{N} \bar{x}_{2k}\Delta L3 = \sum_{k=1}^{N} \bar{y}_k,$$

$$\sum_{k=1}^{N} \bar{x}_{1k}\Delta L1 + \sum_{k=1}^{N} \bar{x}_{1k}^2 \Delta L2 + \sum_{k=1}^{N}(\bar{x}_{1k}\bar{x}_{2k})\Delta L3 = \sum_{k=1}^{N}(\bar{x}_{1k}\bar{y}_k),$$

$$0 + \sum_{k=1}^{N} \Delta x_{1k}\Delta L2 + \sum_{k=1}^{N} \Delta x_{2k}\Delta L3 = \sum_{k=1}^{N} \Delta y_k,$$

15. The computer program product of claim 13, wherein said computer-readable program code determines, upon execution, when the following equations are simultaneously satisfied:

$$\frac{\partial E}{\partial \Delta L1} = \sum_{k=1}^{N}(\Delta L1 + \bar{x}_{1k}\Delta L2 + \bar{x}_{2k}\Delta L3 - \bar{y}_k) = 0,$$

$$\frac{\partial E}{\partial \Delta L2} = \sum_{k=1}^{N}(\bar{x}_{1k}\Delta L1 + \bar{x}_{1k}^2 \Delta L2 + \bar{x}_{1k}\bar{x}_{2k}\Delta L3 - \bar{x}_{1k}\bar{y}_k) = 0,$$

-continued $$\frac{\partial E}{\partial \Delta L3} = \sum_{k=1}^{N} (\bar{x}_{2k}\Delta L1 + \bar{x}_{1k}\bar{x}_{2k}\Delta L2 + \bar{x}_{2k}^2 \Delta L3 - \bar{x}_{2k}\bar{y}_k) = 0.$$

16. A computer program product that is configured to model a multi-gate field effect transistor, said product comprising a computer readable storage medium having computer-readable program code embodied in said medium, said computer-readable program code comprising:
    computer-readable program code that, when executed, determines a square error function E(ΔL1, ΔL2, ..., ΔLn), where n is the number of gate electrodes in the multi-gate field effect transistor and ΔLn is the gate length reduction associated with the nth gate electrode; and
    computer-readable program code that, when executed, determines the gate length reductions for the n gate electrodes of the multi-gate field effect transistor by determining when ∂E/∂ΔL1, ∂E/∂ΔL2, ..., and ∂E/∂ΔLn all equal zero;
    wherein the square error function is defined as:

$$E = \sum_{k=1}^{N} (\Delta L1 + \bar{x}_{1k}\Delta L2 + \ldots + \bar{x}_{(n-1)k}\Delta Ln - \bar{y}_k)^2.$$

17. An apparatus for modeling a multi-gate field effect transistor, comprising:
    means for measuring current through an actual drain-to-source path of the multi-gate field effect transistor at a plurality of actual drain-to-source voltages;
    means for simulating current through a simulated drain-to-source path of the multi-gate field effect transistor at a plurality of simulated drain-to-source voltages;
    means for determining a first derivative of the simulated current with respect to a gate length of a first gate electrode of the multi-gate field effect transistor and a second derivative of the simulated current with respect to a gate length of a second gate electrode of the multi-gate field effect transistor; and
    means for determining electrical gate lengths of the first and second gate electrodes by determining, based on the first derivative and the second derivative, a least squares fit between the measured current and the simulated current;
    wherein said means for measuring current comprises means for measuring I–V characteristics of the multi-gate field effect transistor with all but a first of the gate electrodes therein held at respective fixed control voltages.

18. An apparatus for modeling a multi-gate field effect transistor, comprising:
    means for measuring current through an actual drain-to-source path of the multi-gate field effect transistor at a plurality of actual drain-to-source voltages;
    means for simulating current through a simulated drain-to-source path of the multi-gate field effect transistor at a plurality of simulated drain-to-source voltages;
    means for determining a first derivative of the simulated current with respect to a gate length of a first gate electrode of the multi-gate field effect transistor and a second derivative of the simulated current with respect to a gate length of a second gate electrode of the multi-gate field effect transistor; and
    means for determining electrical gate lengths of the first and second gate electrodes by determining, based on the first derivative and the second derivative, a least squares fit between the measured current and the simulated current;
    wherein said means for simulating current comprises means for simulating I–V characteristics of the multi-gate field effect transistor with all but a first of the gate electrodes therein held at respective fixed control voltages.

19. The apparatus of claim 17, wherein said means for simulating current comprises means for simulating I–V characteristics of the multi-gate field effect transistor with all but a first of the gate electrodes therein held at respective fixed control voltages.

20. An apparatus for modeling a multi-gate field effect transistor, comprising:
    means for measuring current through an actual drain-to-source path of the multi-gate field effect transistor at a plurality of actual drain-to-source voltages;
    means for simulating current through a simulated drain-to-source path of the multi-gate field effect transistor at a plurality of simulated drain-to-source voltages;
    means for determining a first derivative of the simulated current with respect to a gate length of a first gate electrode of the multi-gate field effect transistor and a second derivative of the simulated current with respect to a gate length of a second gate electrode of the multi-gate field effect transistor; and
    means for determining electrical gate lengths of the first and second gate electrodes by determining, based on the first derivative and the second derivative, a least squares fit between the measured current and the simulated current;
    wherein said means for simulating current comprises means for simulating current through a simulated drain-to-source path of the multi-gate field effect transistor at a plurality of simulated drain-to-source voltages of a first polarity and at a plurality of simulated drain-to-source voltages of a second polarity opposite the first polarity.

* * * * *

UNITED STATES PATENT AND TRADEMARK OFFICE
CERTIFICATE OF CORRECTION

PATENT NO. : 6,898,561 B1
DATED : May 24, 2005
INVENTOR(S) : Liu et al.

It is certified that error appears in the above-identified patent and that said Letters Patent is hereby corrected as shown below:

Column 17,
Line 55, should read
--
$$N\Delta L1 + \sum_{k=1}^{N} \bar{x}_{1k}\Delta L2 + \sum_{k=1}^{N} \bar{x}_{2k}\Delta L3 = \sum_{k=1}^{N} \bar{y}_k,$$

$$\sum_{k=1}^{N} \bar{x}_{1k}\Delta L1 + \sum_{k=1}^{N} \bar{x}_{1k}^2\Delta L2 + \sum_{k=1}^{N} (\bar{x}_{1k}\bar{x}_{2k})\Delta L3 = \sum_{k=1}^{N} (\bar{x}_{1k}\bar{y}_k),$$

$$0 + \sum_{k=1}^{N} \Delta x_{1k}\Delta L2 + \sum_{k=1}^{N} \Delta x_{2k}\Delta L3 = \sum_{k=1}^{N} \Delta y_k,$$
--.

Column 18,
Line 3, should read
--
$$\frac{\partial E}{\partial \Delta L1} = \sum_{k=1}^{N} (\Delta L1 + \bar{x}_{1k}\Delta L2 + \bar{x}_{2k}\Delta L3 - \bar{y}_k) = 0,$$

$$\frac{\partial E}{\partial \Delta L2} = \sum_{k=1}^{N} (\bar{x}_{1k}\Delta L1 + \bar{x}_{1k}^2\Delta L2 + \bar{x}_{1k}\bar{x}_{2k}\Delta L3 - \bar{x}_{1k}\bar{y}_k) = 0,$$

$$\frac{\partial E}{\partial \Delta L3} = \sum_{k=1}^{N} (\bar{x}_{2k}\Delta L1 + \bar{x}_{1k}\bar{x}_{2k}\Delta L2 + \bar{x}_{2k}^2\Delta L3 - \bar{x}_{2k}\bar{y}_k) = 0.$$
--.

Signed and Sealed this

Twenty-seventh Day of September, 2005

JON W. DUDAS
*Director of the United States Patent and Trademark Office*